(12) United States Patent
Chen et al.

(10) Patent No.: US 9,437,663 B2
(45) Date of Patent: Sep. 6, 2016

(54) ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Jiangbo Chen, Beijing (CN); Jun Cheng, Beijing (CN); Chunsheng Jiang, Beijing (CN); Baoxia Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/785,905

(22) PCT Filed: Mar. 18, 2015

(86) PCT No.: PCT/CN2015/074450
§ 371 (c)(1),
(2) Date: Oct. 21, 2015

(87) PCT Pub. No.: WO2016/078265
PCT Pub. Date: May 26, 2016

(65) Prior Publication Data
US 2016/0190222 A1  Jun. 30, 2016

(30) Foreign Application Priority Data
Nov. 17, 2014 (CN) .......................... 2014 1 0653519

(51) Int. Cl.
*H01L 29/08* (2006.01)
*H01L 27/32* (2006.01)
(Continued)

(52) U.S. Cl.
CPC ......... *H01L 27/3272* (2013.01); *H01L 27/322* (2013.01); *H01L 27/3262* (2013.01);
(Continued)

(58) Field of Classification Search
CPC ........... H01L 27/3272; H01L 27/3262; H01L 27/322; H01L 29/7869; H01L 29/66969; H01L 51/56
See application file for complete search history.

(56) References Cited

U.S. PATENT DOCUMENTS

2003/0067266 A1\* 4/2003 Kim ..................... H01L 51/5253
    313/504
2009/0021157 A1  1/2009 Kim et al.
2012/0168746 A1\* 7/2012 Yim .................... H01L 27/1225
    257/43

(Continued)

FOREIGN PATENT DOCUMENTS

CN  101030586 A  9/2007
CN  104332478 A  2/2015

OTHER PUBLICATIONS

Search Report and Written Opinion Mailed Aug. 27, 2015 from State Intellectual Property Office of the P.R. China.

*Primary Examiner* — Reema Patel
*Assistant Examiner* — Syed Gheyas
(74) *Attorney, Agent, or Firm* — Dilworth & Barrese, LLP.

(57) ABSTRACT

An array substrate and a fabrication method thereof, and a display device are provided. The array substrate comprises: a pattern of an organic light-emitting layer (11); a pattern of an active layer (4a) located in a thin film transistor region and a pattern of an absorbing layer (4b) located in an open region, which are arranged in a same layer, wherein, the pattern of the absorbing layer (4b) is located in a light outgoing direction of the pattern of the organic light-emitting layer (11), and is made of a transparent material having an ultraviolet absorbing function. In this way, the pattern of the absorbing layer located in the open region can absorb ultraviolet light from outgoing light, so that damage to eyes caused by the outgoing light can be reduced; and the pattern of the active layer and the pattern of the absorbing layer are arranged in a same layer, which, as compared with a manner of separately arranging a layer of an ultraviolet absorbing layer in the array substrate, can reduce a thickness of the array substrate, which is conducive to lighting and thinning a display device.

19 Claims, 2 Drawing Sheets

(51) Int. Cl.
  *H01L 29/786* (2006.01)
  *H01L 29/24* (2006.01)
  *H01L 29/66* (2006.01)
  *H01L 51/56* (2006.01)

(52) U.S. Cl.
  CPC ......... *H01L29/24* (2013.01); *H01L 29/66969* (2013.01); *H01L 29/7869* (2013.01); *H01L 51/56* (2013.01); *H01L 2227/323* (2013.01)

(56) References Cited

U.S. PATENT DOCUMENTS

2013/0134514 A1* 5/2013 Chang ............... H01L 27/12
                                                257/347
2015/0069382 A1* 3/2015 Ahn ................ H01L 29/7869
                                                257/43
2015/0372068 A1* 12/2015 Chou ............... H01L 27/3272
                                                257/40

* cited by examiner

US 9,437,663 B2

ARRAY SUBSTRATE AND FABRICATION METHOD THEREOF, AND DISPLAY DEVICE

TECHNICAL FIELD

Embodiments of the present disclosure relate to an array substrate and a fabrication method thereof, and a display device.

BACKGROUND

Sunlight and light generated by a backlight source include about 3% ultraviolet light, and the ultraviolet light may cause damage to eyes after entering the eyes, further resulting in degradation of vision. Therefore, in order to prevent such ultraviolet light from entering into the eyes, it is usually needed to process a display device to achieve an effect of shielding or absorbing such ultraviolet light.

SUMMARY

Embodiments of the disclosure provide an array substrate and a fabrication method thereof, and a display device; the array substrate can absorb ultraviolet light, and a display device having the array substrate is thin.

In one aspect, an embodiment of the disclosure provides an array substrate, comprising: a pattern of an organic light-emitting layer; a pattern of an active layer located in a thin film transistor region and a pattern of an absorbing layer located in an open region, arranged in a same layer, wherein, the pattern of the absorbing layer is located in a light outgoing direction of the pattern of the organic light-emitting layer, and is made of a transparent material having an ultraviolet absorbing function.

In another aspect, an embodiment of the disclosure provides a fabrication method of an array substrate, comprising: forming a pattern of an active layer located in a thin film transistor region and a pattern of an absorbing layer located in an open region in a same layer, the pattern of the absorbing layer being made of a transparent material having an ultraviolet absorbing function; forming a pattern of an organic light-emitting layer, wherein the pattern of the absorbing layer is arranged in a light outgoing direction of the pattern of the organic light-emitting layer.

In still another aspect, an embodiment of the disclosure provides a display device, comprising any array substrate described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Hereinafter, in conjunction with the drawings and embodiments, the detailed implementation modes of the disclosure will be further described. The following embodiments are merely to describe the technical solution of the disclosure more clearly, but cannot be used for limiting the scope of the disclosure.

Figure 1:
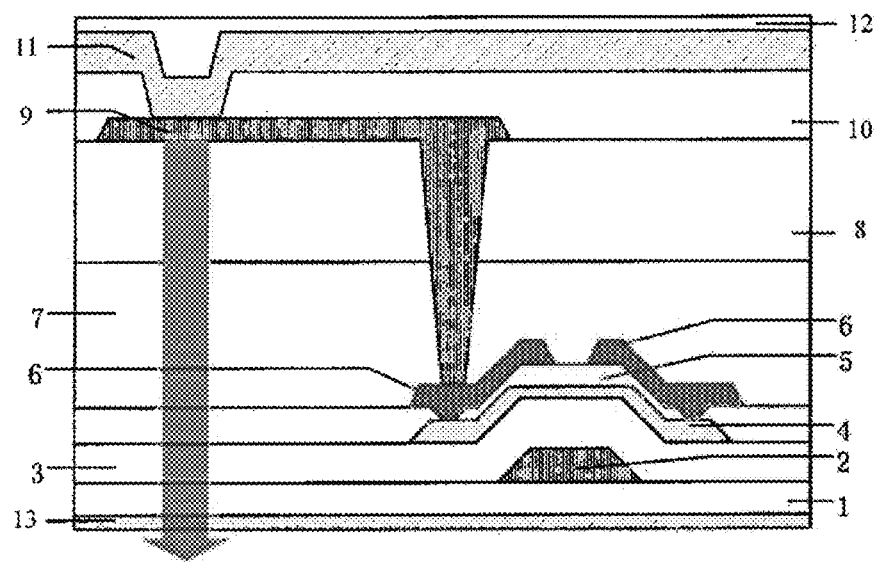
FIG. 1 is a cross-sectional schematic diagram of an array substrate according to an embodiment of the disclosure.

As shown in FIG. 1, a layer of an ultraviolet absorbing layer is separately fabricated in an array substrate to absorb ultraviolet light. FIG. 1 shows a structural schematic diagram of an array substrate of an Organic Light-Emitting Diode (OLED) device; the array substrate comprises: a glass base substrate 1; a pattern of a gate electrode 2, a pattern of a gate insulating layer 3, a pattern of an active layer 4, a pattern of a passivation layer 5, a pattern of a source-drain electrode 6, a pattern of a protective layer 7, a pattern of a planarization layer 8, a first electrode/second electrode 9, a pattern of a pixel defining layer 10, a pattern of an organic light-emitting layer 11, which are sequentially formed on the glass base substrate 1; a second electrode/first electrode 12; and an ultraviolet absorbing layer 13, arranged on a side of the glass base substrate 1 opposite to the pattern of the gate electrode 2, because the ultraviolet absorbing layer 13 is located in a light outgoing direction, it can absorb ultraviolet light from outgoing light emitted by the pattern of the organic light-emitting layer 11. However, such structure will increase an overall thickness of the display device, which is not conducive to lighting and thinning the display device.

A First Embodiment

Figure 2:
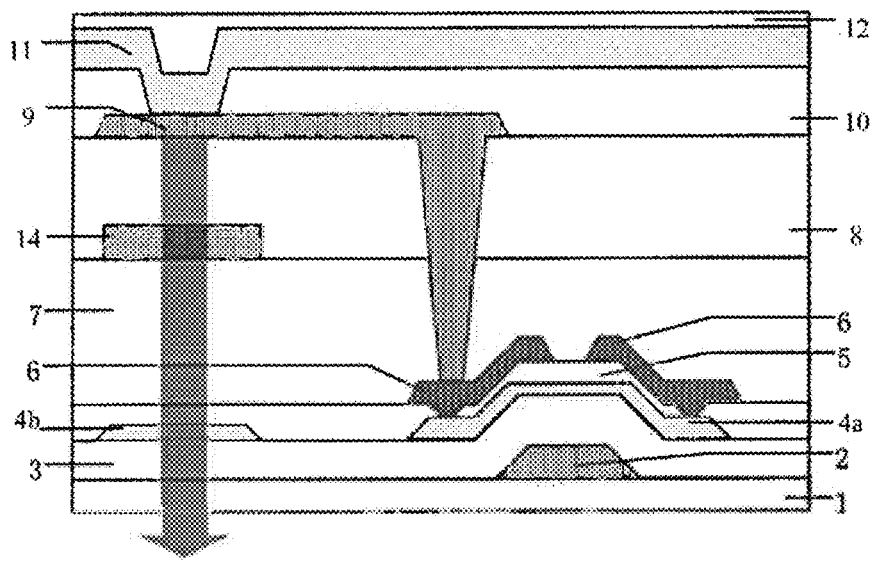
FIG. 2 is a cross-sectional structural schematic diagram of an array substrate provided by a first embodiment of the disclosure.

The first embodiment of the disclosure provides an array substrate, as shown in FIG. 2, comprising: a glass base substrate 1; a pattern of a gate electrode 2 and a pattern of a gate insulating layer 3, sequentially formed on the glass base substrate 1; a pattern of an active layer 4a and a pattern of an absorbing layer 4b, formed on the pattern of the gate insulating layer 3; a pattern of a passivation layer 5, a pattern of a source-drain electrode 6, a pattern of a protective layer 7, a pattern of a color filter layer 14, a pattern of a planarization layer 8, a first electrode/second electrode 9, a pattern of a pixel defining layer 10, a pattern of an organic light-emitting layer 11, a second electrode/first electrode 12, sequentially formed on the pattern of the active layer 4a and the pattern of the absorbing layer 4b, wherein the pattern of the active layer 4a is located in a thin film transistor (TFT) region, for forming a channel of the TFT, and the pattern of the absorbing layer 4b is located in an open region, for absorbing ultraviolet light, and is made of a transparent material having an ultraviolet absorbing function.

Exemplarily, the array substrate is an array substrate of a White Organic Light-Emitting Diode (WOLED) device, the pattern of the organic light-emitting layer 11 is configured to emit white light, and the pattern of the active layer 4a and the pattern of the absorbing layer 4b are located in a light outgoing direction of the pattern of the organic light-emitting layer 11. The pattern of the color filter layer 14 is located on the pattern of the protective layer 7, and the pattern of the planarization layer 8 covers the pattern of the protective layer 7 and the pattern of the color filter layer 14.

In the array substrate provided by the first embodiment of the disclosure, the pattern of the absorbing layer 4b can absorb ultraviolet light from white light emitted by the pattern of the organic light-emitting layer 11, so that damage to eyes caused by outgoing light can be reduced. In another aspect, the pattern of the absorbing layer 4b and the pattern of the active layer 4a are arranged in a same layer, which, as compared with a manner of separately arranging a layer of an ultraviolet absorbing layer in the array substrate, can reduce a thickness of the array substrate, which is conducive to lighting and thinning a display device. Furthermore, because the pattern of the absorbing layer 4b and the pattern of the active layer 4a arranged in the same layer may be formed at a same time, which, as compared with a manner of separately arranging a layer of an ultraviolet absorbing layer, can reduce difficulty in fabricating the array substrate. In addition, the array substrate provided by the first embodiment of the disclosure further comprises the pattern of the color filter layer 14 located in a white light outgoing direction, and thus, in a corresponding display device, it is not necessary to fabricate a color filter substrate separately, further reducing a thickness of a display substrate and difficulty in fabricating the display substrate.

Exemplarily, the pattern of the absorbing layer 4b may be made of an indium gallium zinc oxide (IGZO). A forbidden band width of the IGZO is about 3.4 eV, which has a good absorbing effect on short-wavelength ultraviolet light. The pattern of the absorbing layer 4b made of the indium gallium zinc oxide (IGZO) can be very good at absorbing ultraviolet light from outgoing light.

It should be noted that, in practical application, the pattern of the color filter layer 14 is not necessarily fabricated in the array substrate, and in practical application, a color filter substrate may also be arranged separately. Color display is realized by the color filter substrate. In addition, in an embodiment of the disclosure, the pattern of the color filter layer 14 and the pattern of the planarization layer 8 may not be fabricated between the pattern of the protective layer 7 and the pattern of the pixel defining layer 10; as long as the pattern of the color filter layer 14 is arranged in a light outgoing direction of the pattern of the organic light-emitting layer 11, a corresponding technical solution can achieve a same effect, and correspondingly, should fall into the scope of the embodiments of the disclosure.

In practical application, the pattern of the active layer 4a and the pattern of the absorbing layer 4b may be made of a same material, so that they can be fabricated by one process, further reducing difficulty in fabricating the array substrate.

A Second Embodiment

Figure 3:
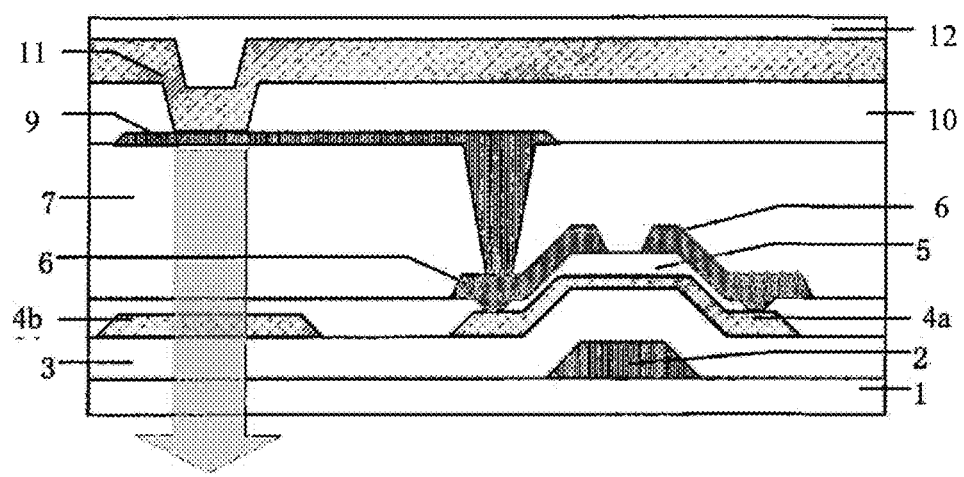
FIG. 3 is a cross-sectional structural schematic diagram of an array substrate provided by a second embodiment of the disclosure.

The second embodiment of the disclosure provides an array substrate, as shown in FIG. 3, comprising: a glass base substrate 1; a pattern of a gate electrode 2 and a pattern of a gate insulating layer 3, sequentially formed on the glass base substrate 1; a pattern of an active layer 4a and a pattern of an absorbing layer 4b, formed on the pattern of the gate insulating layer 3; a pattern of a passivation layer 5, a pattern of a source-drain electrode 6, a pattern of a protective layer 7, a first electrode/second electrode 9, a pattern of a pixel defining layer 10, a pattern of an organic light-emitting layer 11, a second electrode/first electrode 12, which are formed sequentially, wherein the pattern of the active layer 4a is located in a thin film transistor (TFT) region, for forming a channel of the TFT, and the pattern of the absorbing layer 4b is located in an open region, and is made of a transparent material having an ultraviolet absorbing function. As shown in FIG. 3, the pattern of the active layer 4a and the pattern of the absorbing layer 4b are located in a light outgoing direction of the pattern of the organic light-emitting layer 11.

Exemplarily, the array substrate is an array substrate of a polymer light-emitting diode (PLED) device. Different from the array substrate provided by the first embodiment, in the array substrate provided by the second embodiment, the pattern of the organic light-emitting layer 11 is configured to emit colored light, and the array substrate does not comprise a pattern of a color filter layer. In this way, difficulty in fabricating the array substrate can be further reduced. Correspondingly, a pattern of a planarization layer 8 is not arranged.

It should be noted that, in the drawings, sizes of layer and region may be exaggerated in order to make the diagrams clear. It can be understood that, when an element or a layer is called to be located "above" the other element or layer, it may be directly located on the other element, or there may be an intermediate layer. In addition, it can be understood that, when an element or a layer is called to be located "below" the other element or layer, it may be directly located below the other element, or there may be more than one intermediate layers or elements. In addition, it can be understood that, when a layer or an element is called to be located "between" two elements or layers, it may be a unique layer between the two elements or layers, or there may be more than one intermediate layers or elements. Similar reference signs indicate similar elements throughout the disclosure.

An embodiment of the disclosure further provides a fabrication method of an array substrate, for fabricating the array substrate described in any one of the above embodiments, and the method comprises:

Step S1: forming a pattern of an active layer located in a thin film transistor region and a pattern of an absorbing layer located in an open region in a same layer, wherein the pattern of the absorbing layer is made of a transparent material having an ultraviolet absorbing function;

Step S2: forming a pattern of an organic light-emitting layer, wherein the pattern of the absorbing layer is arranged in a light outgoing direction of the pattern of the organic light-emitting layer.

Of course, in practical application, the above fabrication method of the array substrate further comprises a process of fabricating a pattern of a gate electrode, a pattern of a gate insulating layer, a pattern of a passivation layer, a pattern of a source-drain electrode and a pattern of a pixel electrode; in addition, according to different types of the array substrate to be fabricated, the method may further comprise a process of fabricating a pattern of protective layer, a pattern of a planarization layer, a pattern of a pixel electrode, a pattern of a pixel defining layer, a pattern of an organic light-emitting layer and a pattern of a color filter layer, and specific processes of fabricating these layer structures may refer to technologies known by inventors, which will be not repeated here.

Further, the transparent material is an indium gallium zinc oxide.

Further, the step S2 includes:

Forming the pattern of the organic light-emitting layer by using a method of evaporating or printing.

Further, when it is used for forming the array substrate shown in FIG. 2, the method further comprises: forming a pattern of a color filter layer located in the light outgoing direction of the pattern of the organic light-emitting layer.

When it is used for forming the array substrate shown in FIG. 3, it is only needed to form a pattern of an organic light-emitting layer for emitting colored light, but it is not necessary to form a pattern of a color filter layer located in the light outgoing direction of the pattern of the organic light-emitting layer. In this way, one fabrication process can be reduced, and fabrication difficulty can be reduced.

Further, the step S1 includes:

Forming the pattern of the active layer located in the thin film transistor region and the pattern of the absorbing layer located in the open region in a same layer by using a same material and a same process.

In this way, it can save one process of fabricating a layer structure, to reduce difficulty in fabricating the array substrate.

It should be understood that, a sequence of performing operation steps of the fabrication method disclosed by the embodiment of the disclosure is not limited thereto, unless mentioned otherwise. Therefore, the sequence of perform operation steps of the fabrication method disclosed by the embodiment of the disclosure may be changed in the scope of the embodiment of the disclosure, and results obvious to these skilled in the art related to the disclosure are considered to be in the scope of the disclosure.

An embodiment of the disclosure provides a display device, comprising any array substrate described above.

Here, the display device may be: an E-paper, a mobile phone, a tablet computer, a television, a monitor, a laptop, a digital photo frame, a navigator, or any other product or component having a display function.

The array substrate provided by the embodiments of the disclosure comprises a pattern of an organic light-emitting layer, a pattern of an active layer located in a thin film transistor region and a pattern of an absorbing layer located in an open region; and the pattern of the absorbing layer is located in a light outgoing direction of the pattern of the organic light-emitting layer, is made of a transparent material having an ultraviolet absorbing function, and is arranged in a same layer as the pattern of the active layer. In one aspect, the pattern of the absorbing layer located in the open region can absorb ultraviolet light from outgoing light, so that damage to eyes caused by the outgoing light can be reduced. In another aspect, the pattern of the active layer and the pattern of the absorbing layer are arranged in a same layer, which, as compared with a manner of separately arranging a layer of an ultraviolet absorbing layer in the array substrate, can reduce a thickness of the array substrate, which is conducive to lighting and thinning a display device.

The above descriptions are merely embodiments of the disclosure, it should be pointed out that, those skilled in the art may make various improvements and modifications without departing from the principle of the disclosure, and such improvements and modifications should be deemed as being included within the scope thereof.

The present application claims priority of Chinese Patent Application No. 201410653519.X filed on Nov. 17, 2014, the disclosure of which is incorporated herein by reference.

The invention claimed is:

1. An array substrate, comprising:
   a pattern of an organic light-emitting layer;
   a pattern of an active layer located in a thin film transistor region and a pattern of an absorbing layer located in an open region, arranged in a same layer,
   wherein, the pattern of the absorbing layer is located in a light outgoing direction of the pattern of the organic light-emitting layer, and is made of a transparent material having an ultraviolet absorbing function.

2. The array substrate according to claim 1, wherein the transparent material is an indium gallium zinc oxide.

3. The array substrate according to claim 1, wherein the pattern of the organic light-emitting layer is configured to emit white light.

4. The array substrate according to claim 1, wherein the pattern of the organic light-emitting layer is configured to emitting colored light.

5. The array substrate according to claim 1, wherein the pattern of the active layer is made of material which is a same as that of the pattern of the absorbing layer.

6. The array substrate according to claim 3, wherein the array substrate further comprises a pattern of a color filter layer located in the light outgoing direction of the pattern of the organic light-emitting layer.

7. A display device, comprising the array substrate according to claim 1.

8. A display device, comprising the array substrate according to claim 2.

9. A display device, comprising the array substrate according to claim 3.

10. A display device, comprising the array substrate according to claim 4.

11. A display device, comprising the array substrate according to claim 5.

12. A display device, comprising the array substrate according to claim 6.

13. A fabrication method of an array substrate, comprising:
   forming a pattern of an active layer located in a thin film transistor region and a pattern of an absorbing layer located in an open region in a same layer, the pattern of the absorbing layer being made of a transparent material having an ultraviolet absorbing function;
   forming a pattern of an organic light-emitting layer,
   wherein the pattern of the absorbing layer is arranged in a light outgoing direction of the pattern of the organic light-emitting layer.

14. The fabrication method according to claim 13, wherein the transparent material is an indium gallium zinc oxide.

15. The fabrication method according to claim 13, wherein the forming a pattern of an organic light-emitting layer comprises:
   forming the pattern of the organic light-emitting layer by using a method of evaporating or printing.

16. The fabrication method according to claim 13, wherein the pattern of the organic light-emitting layer is configured to emit white light.

17. The fabrication method according to claim 16, the method further comprises: forming a pattern of a color filter layer located in the light outgoing direction of the pattern of the organic light-emitting layer.

18. The fabrication method according to claim 13, wherein the pattern of the organic light-emitting layer is configured to emit colored light.

19. The fabrication method according to claim 13, wherein the forming a pattern of an active layer located in a thin film transistor region and a pattern of an absorbing layer located in an open region in a same layer comprises:
   forming a pattern of an active layer located in a thin film transistor region and a pattern of an absorbing layer located in an open region in a same layer by using a same material and a same process.

* * * * *